United States Patent [19]

Blitchington et al.

[11] 4,307,961
[45] Dec. 29, 1981

[54] APPARATUS FOR PRECISELY ALIGNING A PAIR OF ELEMENTS

[75] Inventors: Frank H. Blitchington; Jack C. Hetherington, both of Richmond, Va.

[73] Assignee: Western Electric Company, Inc., New York, N.Y.

[21] Appl. No.: 26,264

[22] Filed: Apr. 2, 1979

[51] Int. Cl.³ .............................................. G01B 11/00
[52] U.S. Cl. ..................................... 356/400; 356/150
[58] Field of Search ...................... 356/400, 401, 150; 250/548; 350/86; 355/86, 72, 73, 75, 76

[56] References Cited

U.S. PATENT DOCUMENTS

| | | | |
|---|---|---|---|
| 3,416,853 | 12/1968 | Pickett | 350/86 |
| 4,070,117 | 1/1978 | Johannsmeier et al. | 356/400 |
| 4,109,158 | 8/1978 | Blitchington et al. | 356/400 |
| 4,153,371 | 5/1979 | Koizumi et al. | 356/400 |
| 4,171,162 | 10/1979 | Gerard et al. | 356/401 |
| 4,233,625 | 11/1980 | Altman | 356/400 |

OTHER PUBLICATIONS

"Flex Screen Printer Operation and Maintenance" Western Electric Company, Inc. pp. 1-5, 13-17.
"A Self-Correcting System for Maintaining Alignment of Webs Between Vacuum Drums" Technical Digest (Western Electric) No. 31, Jul. 1973.

*Primary Examiner*—R. A. Rosenberger
*Attorney, Agent, or Firm*—J. B. Hoofnagle

[57] ABSTRACT

A continuous flexible web includes a flat, flexible, non-conductive substrate with copper cladding on at least one major surface of the substrate. Prepunched holes may be formed in and through the web and may provide through-hole connections between printed circuits ultimately formed on opposite sides of the substrate.

Successive sections of the web are indexed through a screen printing apparatus. A photocell system cooperates with preformed through-slots formed selectively in the web and windows formed in a platen beneath the section to precisely locate the platen with the section and relative to a circuit pattern formed in a screen above the section. The underside of the section is then held with the platen and the screen is positioned over the top side of the section. Ink is then flooded onto the screen and ultimately wiped through circuit-pattern openings in the screen and onto the section to form an inked impression of the circuit pattern on the section.

14 Claims, 12 Drawing Figures

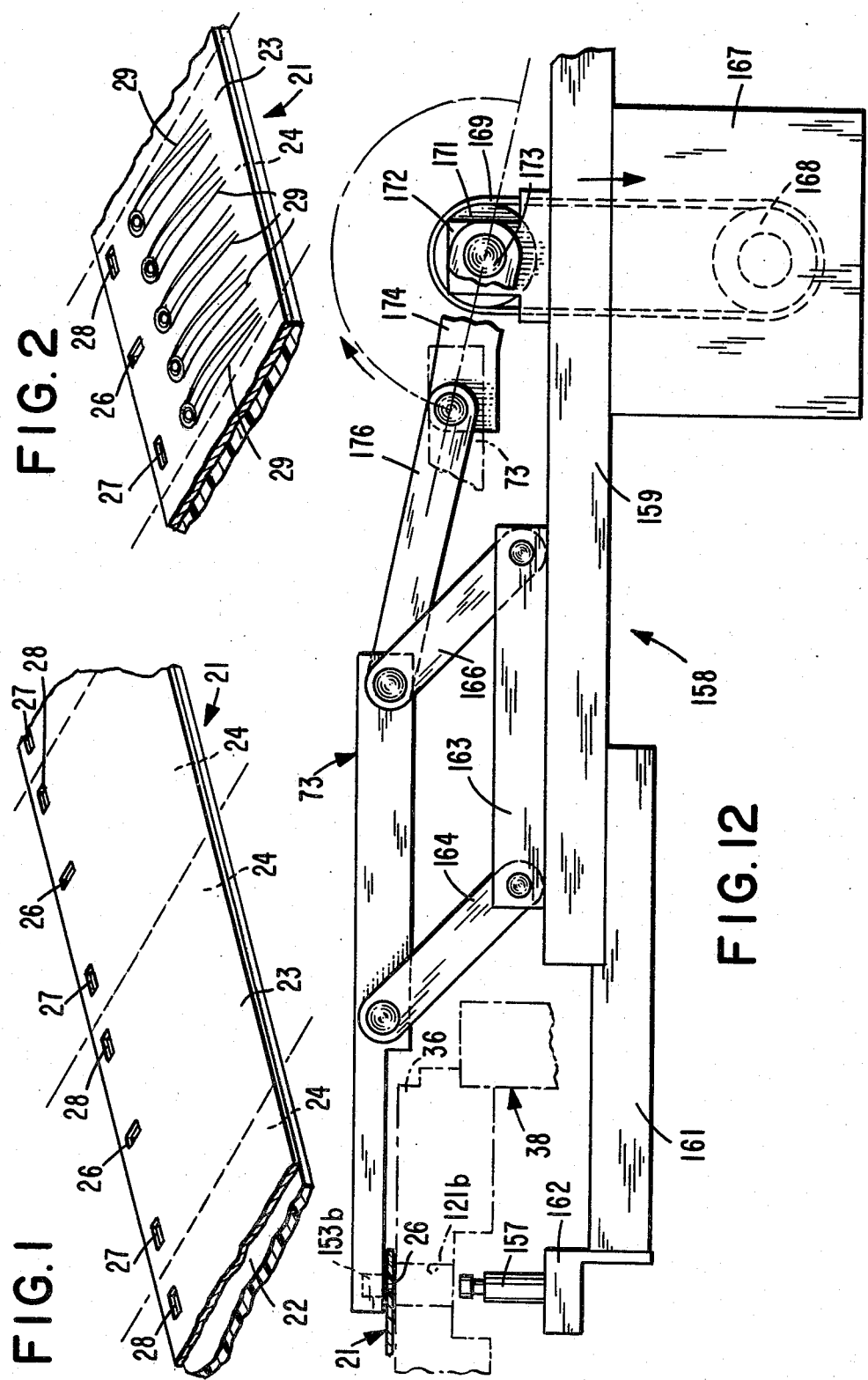

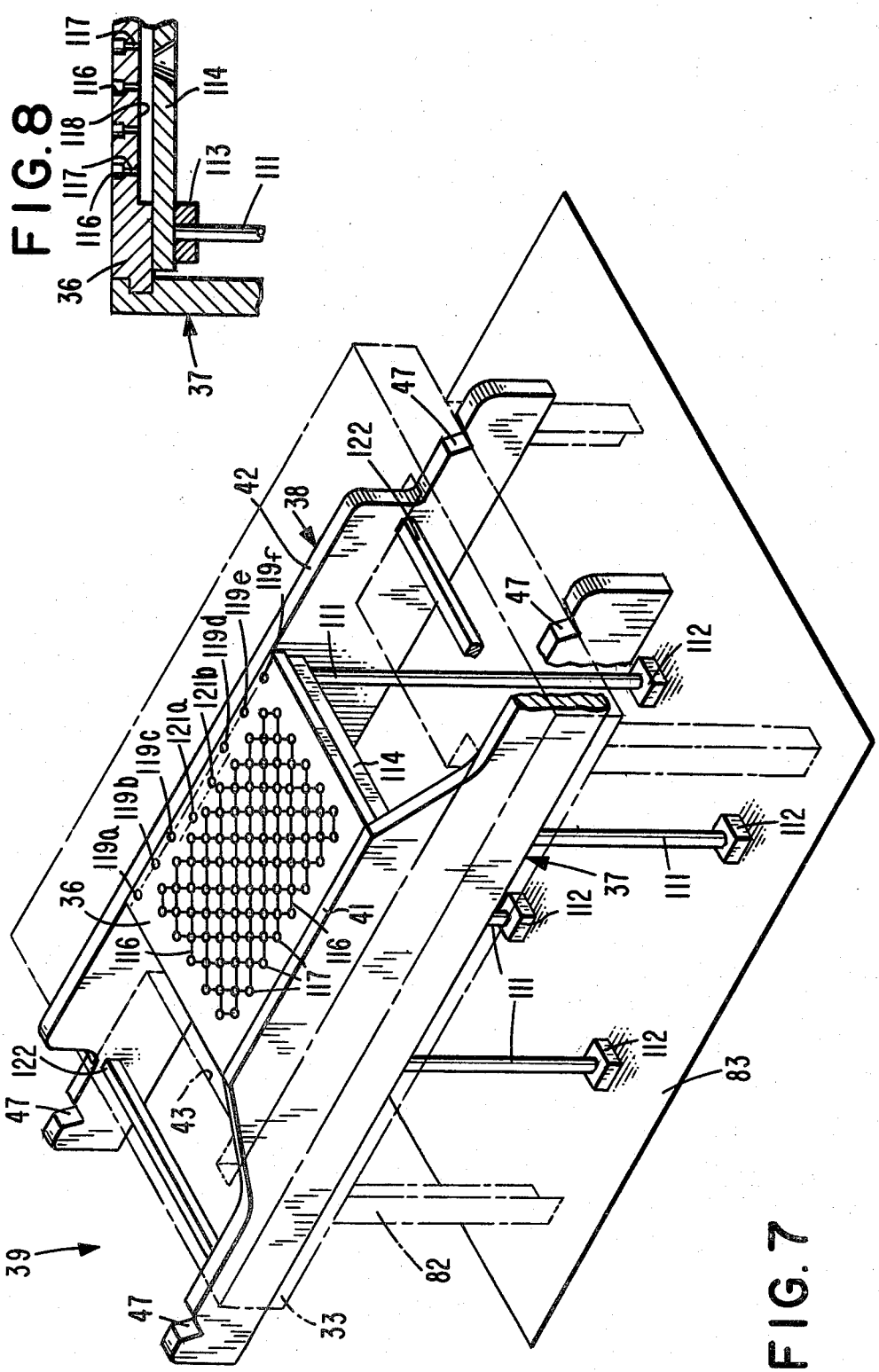

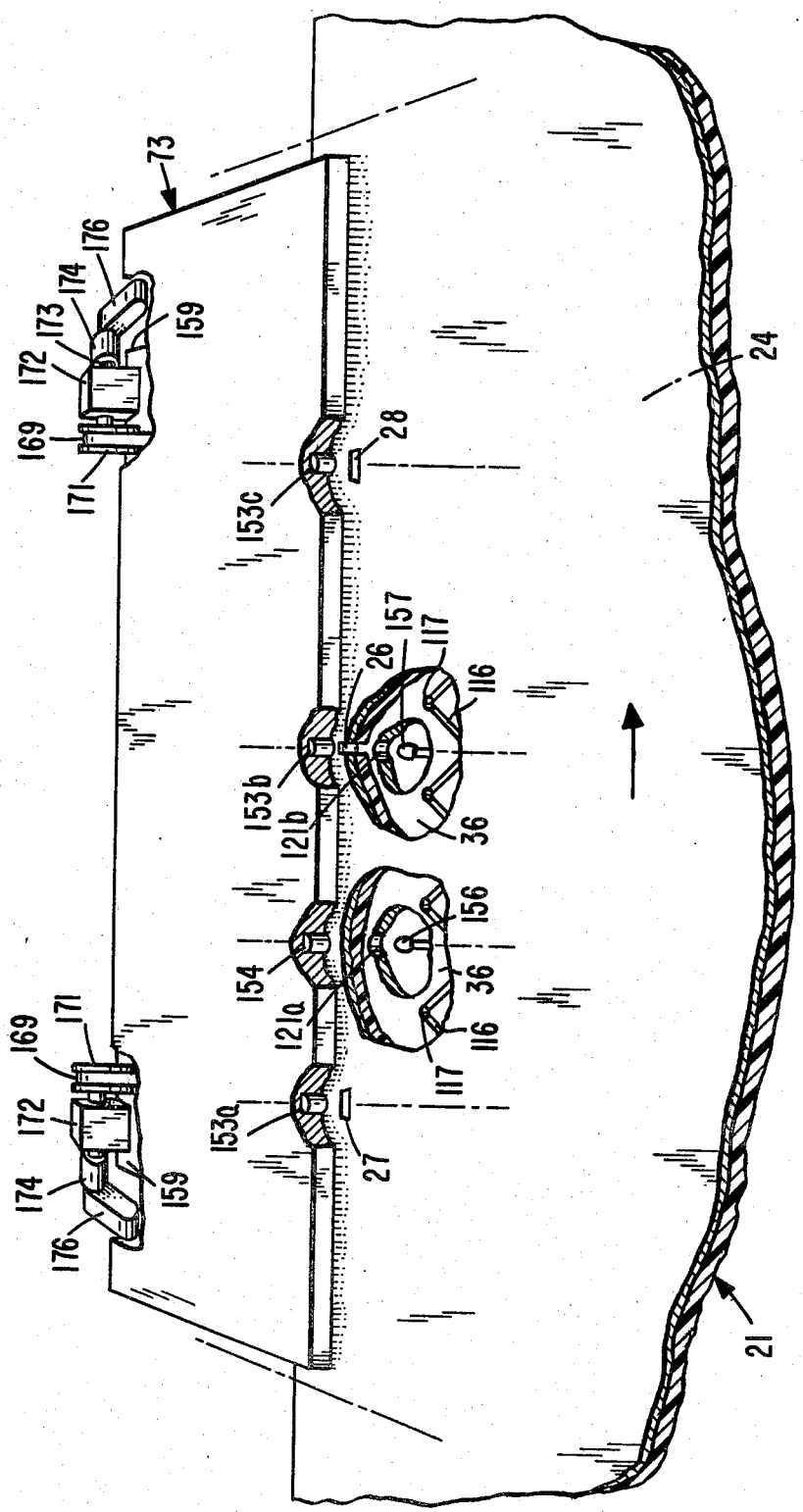

APPARATUS FOR PRECISELY ALIGNING A PAIR OF ELEMENTS

TECHNICAL FIELD

This invention relates to apparatus for precisely aligning a pair of elements and particularly to apparatus for precisely aligning a platen-supported substrate with a screen pattern in preparation for a screen printing operation.

BACKGROUND OF THE INVENTION

In the manufacture of printed circuits by a screen printing technique, a circuit pattern is formed in a screen by filling selected mesh openings of the screen with a fluid material which solidifies. The unfilled mesh openings thereby form the desired circuit pattern.

In one method of using the screen printing technique, a substrate, having copper cladding on at least one surface, is placed on a platen. The pattern-containing screen is placed over the other substrate surface which contains copper cladding. Ink is flooded over the entire exposed surface of the screen but is not forced through the circuit-pattern openings thereof. A squeegee is then moved over the ink-flooded side of the screen to force ink through the circuit-pattern openings and onto the copper cladding of the substrate to define thereon the inked circuit pattern. The squeegee also wipes the excess ink into a pool or reservoir on one side of the top of the screen for use in the next flooding operation. The screen is then raised to reveal the substrate with the inked circuit pattern on the copper cladding. The pattern-inked substrate is then processed in a conventional manner to form a printed circuit thereon.

A screen printer which performs in the foregoing manner is commercially available from The Dia-Print Company, Inc. of Phoenix, Ariz. and is identified as an Itron Printer, Model TNTW.

Specifically, the Itron Printer includes an open-top housing which supports the circuit-pattern screen in the bottom thereof. A platen is located on a substrate-support table and is positioned below the housing. A pair of locating pins are secured to the underside of the housing and are seatable within locating apertures in the table to facilitate accurate positioning of the screen relative to the platen. A cross arm extends between opposite sides of, and within, the housing. The arm is secured at the ends thereof to a chain-drive mechanism which facilitates motor-driven movement of the arm between the front and rear of the housing in either direction. An air cylinder is mounted on the arm to facilitate partial rotational movement of the arm about its axis. A flooding bar and a squeegee are supported along the length of the arm and extend between the sides of the housing over the screen.

In use, a supply of ink, in a semi-viscous state, is deposited onto a portion of the screen near the front of the housing to form the pool or reservoir. The air cylinder is controlled to pivot the arm so that the flooding bar is close to the screen and in position adjacent to the deposited ink. With the arm in this position, the squeegee is positioned sufficiently above the screen and ink so that it will not engage the ink. The arm is then moved to the rear of the housing whereby the flooding bar spreads or floods the ink over the screen but is sufficiently above the screen to avoid forcing ink through the circuit-pattern openings of the screen.

A copper clad substrate is positioned on the platen and the housing is lowered whereby the locating pins seat in the table openings to accurately locate the platen with the screen. The air cylinder partially rotates the arm to move the flooding bar substantially above the screen and the flooded ink and to move the squeegee into the ink-wiping position. The arm is then moved toward the front of the housing whereby ink is wiped or forced through the circuit-pattern openings and onto the copper clad substrate. The squeegee wipes the excess ink into the pool or reservoir adjacent the front of the housing in preparation for the next flooding operation. The housing is then raised and the substrate containing the inked pattern can be removed. The substrate is then processed in a conventional manner to form printed circuits on the substrate.

In a method of manufacturing flexible printed circuits using the screen printing technique, circuit patterns are screen-linked directly onto a surface of copper cladding of successive sections of a flexible web with land areas of the inked patterns desirably located about positions whereat holes have been punched in the cladding and through the web. Thereafter, those portions of the copper cladding which are not covered by the ink are removed in an etching process. The ink is then removed from the remaining copper cladding and additional copper is deposited onto the now-exposed cladding, onto the walls of the now punched holes and, if desired, onto similarly formed circuit patterns of copper cladding on the opposite side of the flexible web.

To facilitate the screen printing process, a series of through slots are placed in spaced relation in each of successive sections of the flexible web along one margin thereof in a precise relationship to the positions whereat holes are simultaneously punched through the web. In addition, slot locators are formed in the screen in precise relationship to circuit patterns in the screen and are designed to coincide with the through slots of the flexible web when the screen and successive web sections are subsequently aligned.

A light source is aligned with the slot locators in the screen and, but for the presence of the flexible web, would normally direct light rays onto light sensitive devices, such as photo-diodes, which are mounted in a sensor bar movably positioned between the screen and the web but also secured to the screen for movement therewith. The light sensitive devices are connected to a control system to assist in the control of a pair of web feed drums, at entrance and exit locations to the screen, which cooperate to accurately position the flexible web under the sensor bar and to simultaneously move the screen therewith. Thereafter the sensor bar is retracted independently of the screen and a screen positioning mechanism is controlled to accurately position the circuit pattern of the screen relative to the flexible web.

In operation, successive sections of the flexible web are indexed adjacent to the sensor bar and the screen and each section is accurately aligned with the photo-diodes for the screen printing operation. As each section of the flexible web is indexed into a position adjacent to the screen, a first of the slots in the web passes one of the light sensitive devices which is activated to facilitate the slowing of the feed of the web. Thereafter, the same slot in the flexible web is positioned for alignment with another of the light sensitive devices which responds and develops a voltage to control the synchronous operation of the feed drums and accurately align the slot with the light sensitive device so that the section of the flexible web is aligned accurately in the longitudinal direction with the ultimately positioned circuit pattern on the screen.

As the first slot is positioned for alignment with the corresponding light sensitive device, two other slots in the flexible web are also positioned to be aligned with corresponding light sensitive devices. When these slots and corresponding light sensitive devices are generally aligned, the devices respond to develop voltages which provide for the movement of a support jointly for the light sensitive devices and the screen to precisely align the two other slots with the corresponding light sensitive devices and thereby provide for the precise lateral alignment of the circuit pattern with the section of the flexible web.

After the two-direction alignment is accomplished, the sensor bar is retracted independently of the screen. A table which is positioned adjacent to the web on the side opposite the screen, vacuum grips the section of the flexible web and moves the web section to a spaced position beneath the screen. Thereafter, ink is deposited onto the screen and subsequently wiped through the pattern and onto the copper cladding of the web.

A reverse procedure is initiated to release the gripped web section and the next successive section of the web is then moved to align the next successive section with the circuit pattern for the next ink printing operation.

A screen printing system similar to the type described above has been described in the "Description of the Prior Art" section of U.S. Pat. No. 4,109,158 which, by reference thereto, is incorporated herein.

The above-described apparatus for performing the screen printing operation in the manufacture of flexible printed circuits involves the manipulation of the housing which supports the screen and the facilities for flooding and wiping the ink over and through the pattern in the screen. In the controlled manipulation of the housing, surfaces of the housing must slide over fixed support surfaces to facilitate the accurate aligning of the slots of the web and the corresponding slot locators of the screen to precisely locate the circuit pattern over the web prior to the screen printing operation. During the positioning period, static friction between the housing surfaces and the support surfaces must be overcome before positioning movement is attained. This results in a time lag where the movement of the housing is not immediately responsive. Further, once the static friction has been overcome, the moving force applied to the housing may be excessive for the critical positioning of the screen and results in "overshooting" of the desired position. Thus, damping compensation must be provided to reduce the effects of such "overshooting."

SUMMARY OF THE INVENTION

The present invention contemplates an apparatus for precisely aligning a first element with a second element. The apparatus includes means for aligning a first-element gripping means with the second element to establish a reference alignment, means for moving the first element into general alignment with the gripping means which then grips the first element and means for moving the gripping means with respect to the reference alignment to align precisely the first element with the second element.

The apparatus further includes means for supporting together the gripping means and the first-element moving means while the first-element moving means grips side portions of the first element. Still further, the apparatus includes means for providing frictionless movement of the gripping means and the first-element moving means when the first element is being precisely aligned with the second element.

BRIEF DESCRIPTION OF THE DRAWINGS

FIG. 1 is a partial perspective view showing a section of a flexible web having copper cladding and preformed slots;

FIG. 2 is a partial perspective view showing the web section of FIG. 1 having ink-printed circuit patterns thereon;

FIG. 7 is a perspective view showing a floating platen assembly of the apparatus of FIG. 3 in accordance with certain principles of the invention;

FIG. 8 is a partial sectional view showing a support portion of the platen assembly of FIG. 7 in accordance with certain principles of the invention;

FIG. 11 is a perspective view showing a sensor bar containing light-sensitive photo-diodes for facilitating alignment of the platen assembly of FIGS. 7 and 8 with the flexible web of FIG. 1; and FIG. 12 is a side view showing a mechanism for moving the sensor bar of FIG. 11 relative to the platen assembly of FIGS. 7 and 8 in accordance with certain principles of the invention to permit the screen printing mechanism of FIGS. 3 and 4 to be positioned over the assembled web of FIG. 1 and the platen assembly.

DETAILED DESCRIPTION

Figure 3:
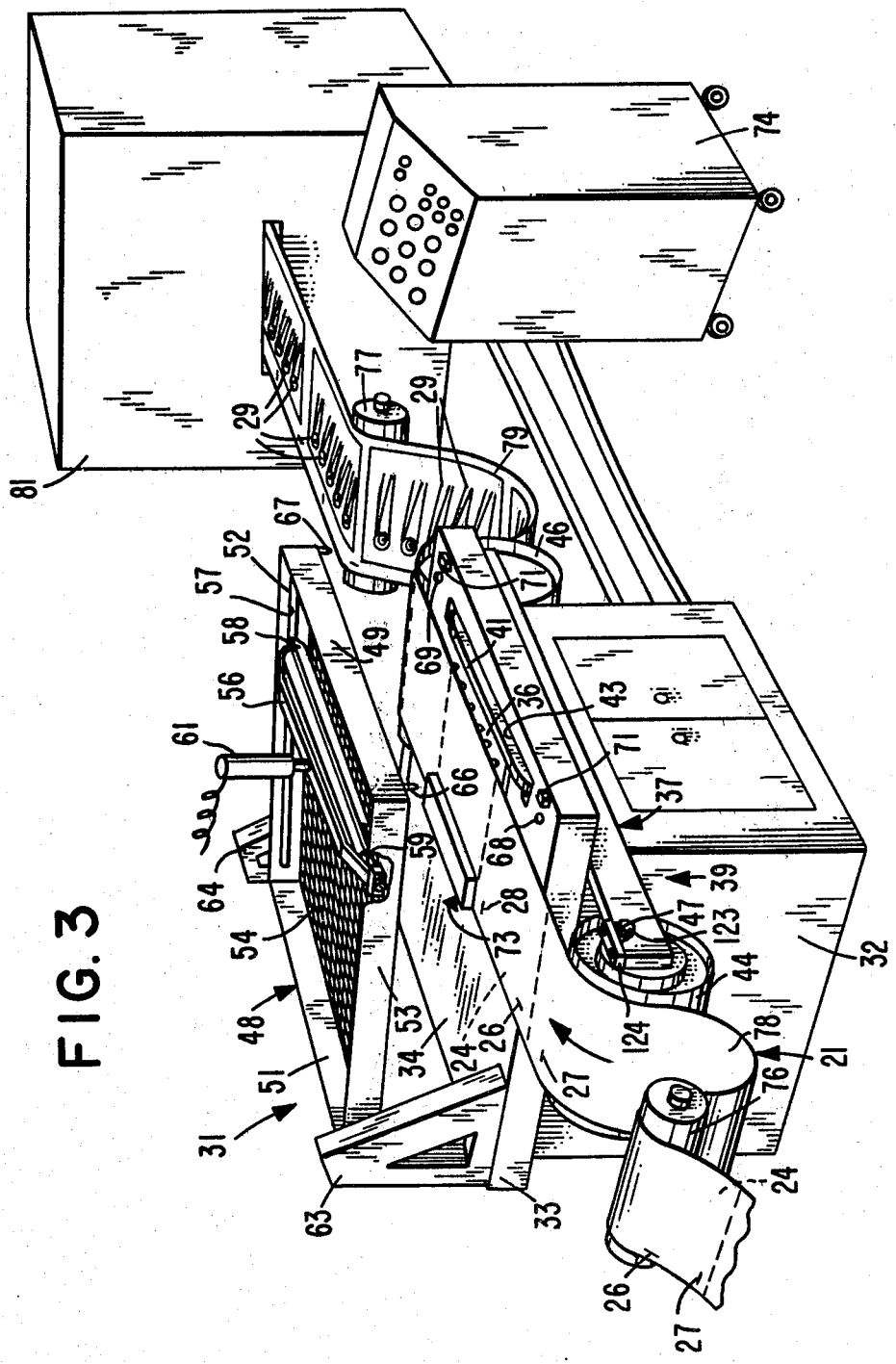
FIG. 3 is a perspective view showing a screen printing apparatus for applying the ink-printed patterns of FIG. 2.

The aforementioned U.S. Pat. No. 4,109,158 discloses an apparatus for positioning a section of a resist-coated, copper clad, flexible web into precise alignment with a circuit pattern master. After precise alignment of the web section and the pattern master, a light exposure system is activated to expose, and develop, the resist not covered by the pattern master.

To assist in the precision alignment of the web section with the pattern master, a pair of vacuum feed drums are located on the forward and trailing sides of the pattern master. The drums are formed with peripheral slots with a constant vacuum source being applied to selected slots as the slots pass adjacent to the web sections to be vacuumly gripped thereby. The drums are mounted on a fixed support and cooperate to move the web sections adjacent to the pattern master.

In the precision alignment of the web sections with the pattern master, slots in the sections are to be aligned with window openings in the pattern master. To assist in this alignment, a photo aligning system is utilized and employs photo-diodes having split sensing elements. In particular, each photo-diode has a pair of spaced sensing elements. When light, from a prepositioned source, falls equally upon the pair of elements, there is no voltage output from the photo-diode. When light falls unequally on the spaced sensing elements, an output voltage is provided by the photo-diode with the amplitude of the voltage being dependent upon the level of unequalness.

As described in the aforementioned U.S. Pat. No. 4,109,158, a phototransistor senses a particular slot in the moving web and signals the vacuum feed drums to decelerate in preparation for the stopping of a web section, which contains the paticular slot, at a position adjacent to the pattern master. Ultimately, the particular slot is located generally adjacent to a window opening in the pattern master.

Upon the general alignment of the slot and window opening, light passes therethrough and falls upon a photo-diode which assumes the control of the rotational drive of the vacuum feed drums. If light is falling unequally on the pair of sensing elements, a signal is developed and applied to the rotational drive of the vacuum drums to facilitate positioning of the web to align precisely the slot and the window opening. This control could involve the reversal of movement of the vacuum drums or the continued forward movement thereof. In any event, the slot and window opening are ultimately precisely aligned whereby light falls equally upon the sensing elements and the vacuum drums stop rotating. At this time, the web section is now aligned with the pattern master in the direction of travel, or "X" direction, of the web. However, vacuum continues to be applied to those peripheral slots of the drums which are adjacent to the spaced sections of the web now in a stationary holding position over a portion of the spaced drums. In this position, the section of the web between the two drums, and which is positioned adjacent to the pattern master, is held taut thereby.

As the particular slot is aligned with the adjacent window opening, two other slots in the web section, which are spaced on opposite sides of the particular slot, come into general alignment with adjacent window openings in the pattern master. When the two spaced slots become generally aligned with the adjacent window openings, light from light sources passes through the generally aligned slots and window openings and falls upon each of a pair of photo-diodes aligned with the light sources. If the spaced slots are not precisely aligned with the window openings, the light falls unequally upon the sensing elements of the photo-diodes and signals are generated in response thereto. The signals are fed to a pair of motors which operate independently of each other to facilitate lateral, or "Y" direction, positioning of the pattern master to bring the window openings in precise alignment with the adjacent slots. When precise alignment occurs, light falls equally upon the sensing elements of the photo-diodes and the signals cease. In this manner, the web section is now precisely aligned with the pattern master in the lateral or "Y" direction.

Thus, the vacuum drums cooperate with the photo-aligning system and move the web section in the travel direction to precisely align the web section and the pattern master in the "X" direction. Further, the photo-aligning system facilitates lateral movement of the pattern master to then precisely align the web section and the pattern master in the "Y" direction.

After the web section has been precisely aligned with the pattern master, the web section is vacuumly gripped and placed in intimate contact with the aligned pattern master in an air-tight enclosure.

As noted above, the disclosure of the aforementioned U.S. Pat. No. 4,109,158 is incorporated herein by reference thereto.

Referring to FIG. 1 of this aplication, there is illustrated a portion of a flexible web designated generally by the numeral 21. The flexible web 21 includes a non-conductive substrate 22 covered at least on one side with a thin layer 23 of copper. If desired, the other side of the substrate may also be covered with a layer of copper (not shown). The flexible web 21 is divided into successive web sections 24 along the length thereof. Each web section 24 contains a "X" direction slot 26 which is centrally located adjacent one edge of the web 21 and extends longitudinally between side edges of the web section. Each web section 24 also contains a pair of "Y" direction slots 27 and 28 located on and spaced from opposite sides of the "X" direction slot 26. The slots 27 and 28 extend longitudinally along the length of the web 21.

The distance between the "X" slot 26 and each of the "Y" slots 27 and 28 is equal. The slots 26, 27 and 28 are located precisely with respect to a plurality of the same pattern 29 (FIG. 2) which are to be printed, in ink, on the layer 23 of copper. The illustrated distance between the slot 26 and each of the slots 27 and 28 is representative of one code of a flexible printed circuit (not shown) to be manufactured using the web 21. In this instance, the code represents the length dimension of the web section 24 in the longitudinal direction of the web 21. Other codes may be manufactured having web sections 24 of different lengths. For example, if three codes of circuits were to be manufactured, the distance between the slot 26 and the slots 27 and 28 of the web sections 24 of each code would be different from the distance of the other two codes. In a practical application, the web 21 would be supplied on a roll (not shown) with all of the web sections 24 being of the same length. If it is desired to manufacture a different code, another roll would have to be used. The distance between the "X" slot 26 and each of the "Y" slots 27 and 28 could be unequal without departing from the spirit and scope of the invention.

Referring to FIG. 2, there is illustrated one section 24 of the web 21. The pattern 29 of a circuit is printed in ink at several spaced locations on the layer 23 of copper. The ink covers portions of the copper layer 23 in those areas which will ultimately form printed circuits (not shown) on the non-conductive substrate 22. After the ink has been applied in the pattern 29, the flexible web 21 is processed through various conventional facilities to manufacture the substrate-supported printed circuits.

Referring now to FIG. 3, there is illustrated a screen printing apparatus, designated generally by the numeral 31, for applying ink in the pattern 29 on the web section 24. The apparatus 31 includes a cabinet 32 which encloses the base of a fixed table 33 having a horizontally disposed top 34. A platen 36 is supported between a fron arm, designated generally by the numeral 37, and a rear arm, designated generally by the numeral 38, (FIGS. 7 and 9) of a floating platen assembly, designated generally by the numeral 39, clearly illustrated in FIG. 7. The platen 36 and adjacent central portions 41 and 42 of the arms 37 and 38, respectively, extend into and through an opening 43 formed in the top 34 of the fixed table 33. A pair of vacuum drums 44 and 46 are supported for rotation in spaced "V" notches 47 formed in the tops at the ends of the arms 37 and 38 as clearly illustrated in FIGS. 7 and 9.

A screen printing mechanism, designated generally by the numeral 48, includes an open-top enclosure having a front wall 49, a rear wall 51 and spaced side walls 52 and 53. A screen 54 is mounted in a screen chase (not shown) which forms the base of the open-top enclosure. Selected mesh openings of the screen 54 have been filled with a hardened material while the remaining mesh openings are unfilled. The unfilled openings of the screen 54 form the circuit pattern which facilitates the printing, in ink, of the pattern 29 onto the layer 23 (FIGS. 1 and 2) of copper.

A cross arm 56 extends between the side walls 52 and 53 with the ends of the arm extending into longitudinal slots 57 (one shown) formed in the side walls. The slots 57 extend essentially from the front portion to the rear portion of the walls 52 and 53. The ends of the cross arm 56 are mounted for partial rotational movement relative to the slots 57 and for traversing movement within the slots by virtue of a motor-driven chain system (not shown). A flooding bar 58 is mounted to a front side of the cross arm 56 and an ink-wiping squeegee 59 is mounted to a rear side of the cross arm. The flooding bar 58 and the squeegee 59 extend essentially between the side walls 52 and 53 and are essentially parallel with the front wall 49 and the rear wall 51. An air cylinder 61 is mounted above the cross arm 56 to rotate the arm and thereby selectively control the positioning of the flooding bar 58 and the squeegee 59 during a screen printing operation.

Figure 4:
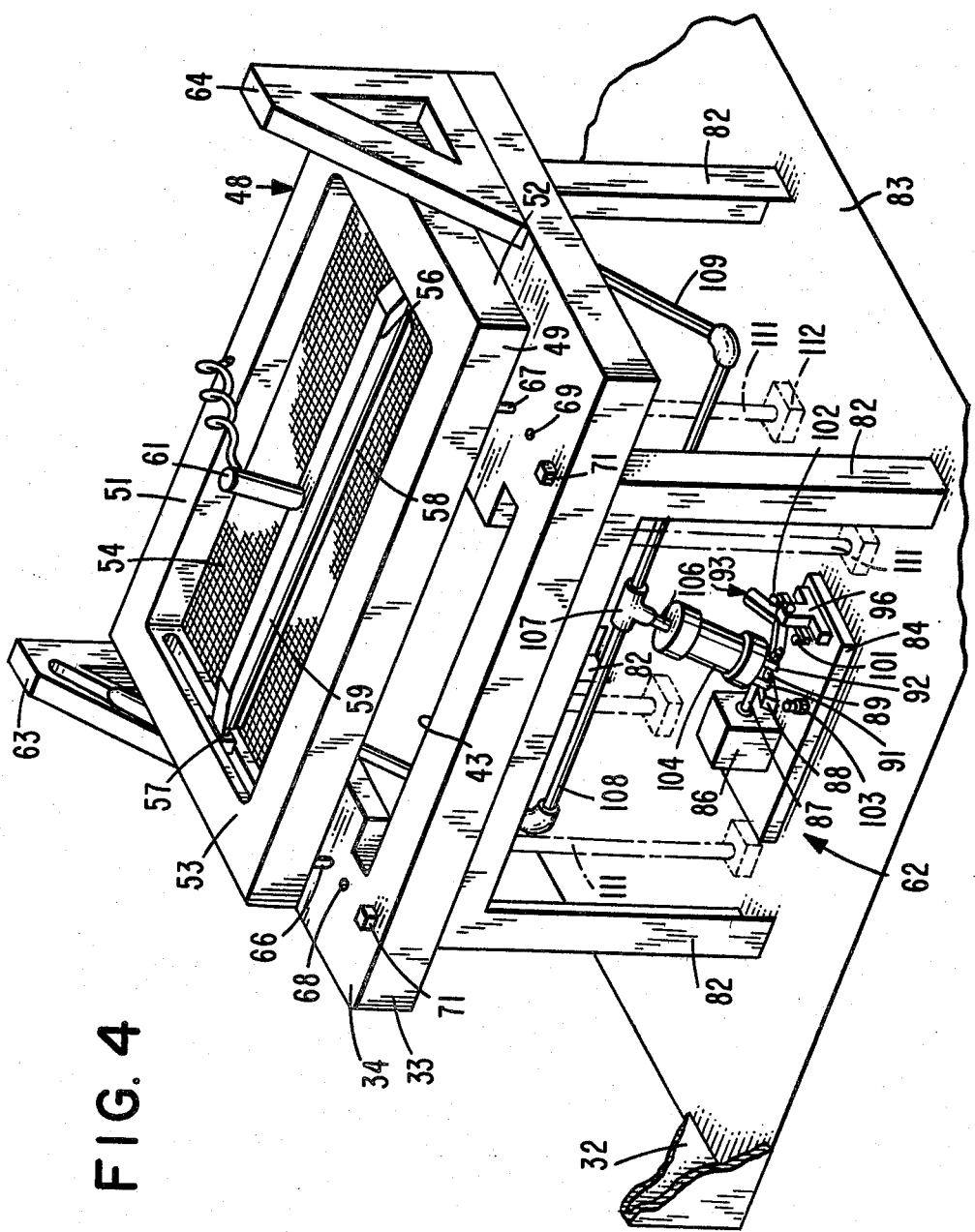
FIG. 4 is a perspective view showing a fixed table and screen printing mechanism of the apparatus of FIG. 3.
Figure 5:
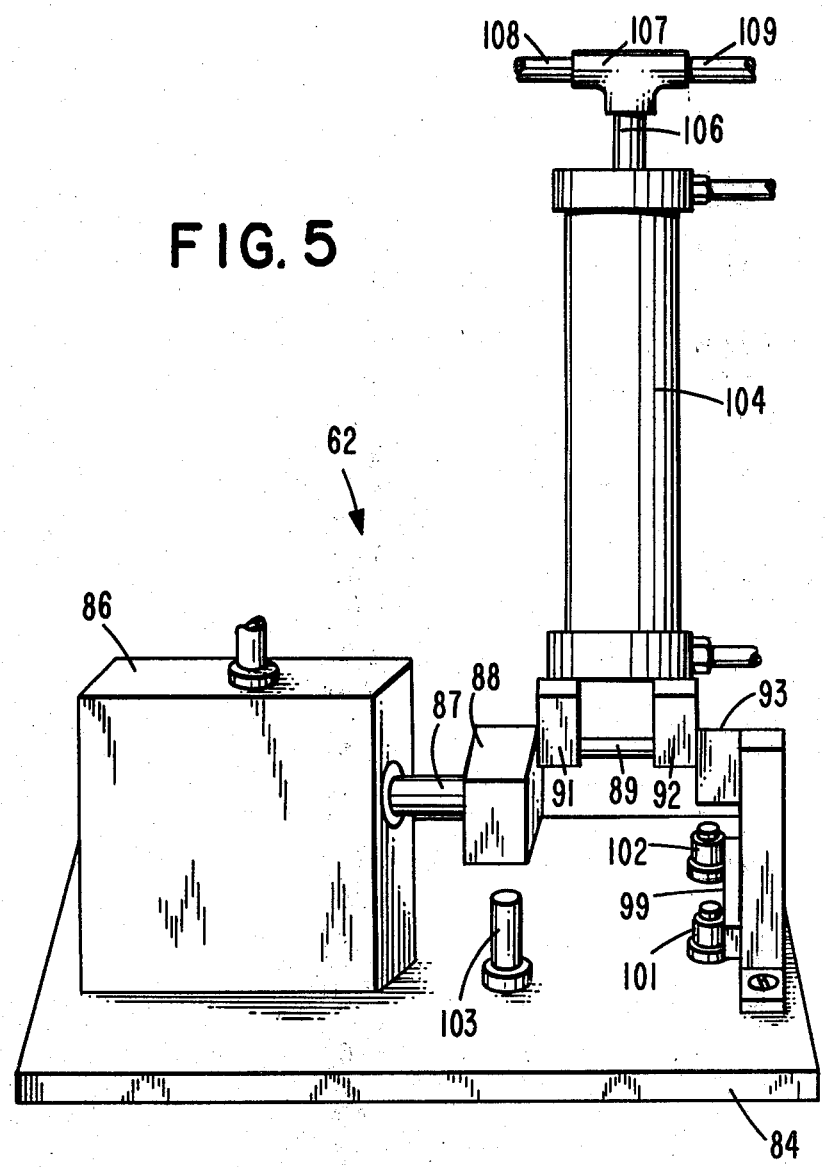
FIG. 5 is a perspective view showing a positioning device for positioning the screen printing mechanism of FIG. 4.
Figure 6:
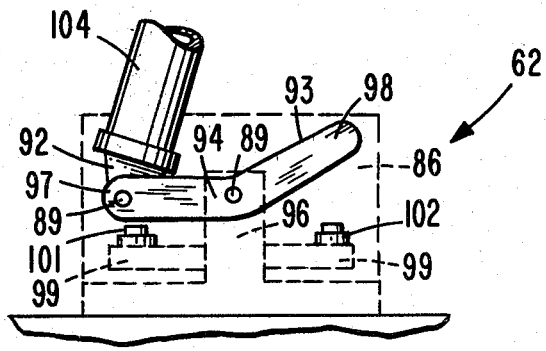
FIG. 6 is a side view showing portions of the positioning device of FIG. 5.

The rear outside portions of the side walls 52 and 53 are mounted for vertical movement by a vertical mover, designated generally by the numeral 62, illustrated in FIGS. 4, 5 and 6. The portions of the vertical mover 62 which are attached to the side walls 52 and 53 are contained for movement within triangular housings 63 and 64 mounted on top of the table 33.

A pair of locating pins 66 and 67 are secured to spaced front portions of the underside of the open-top enclosure and are insertable into apertures 68 and 69, respectively, formed in the top 34 of the fixed table 33. When the screen printing mechanism 48 is lowered in anticipation of a screen printing operation, the pins 66 and 67 move into the apertures 68 and 69, respectively, and serve to locate the mechanism relative to the platen 36 which protrudes through the opening 43 of the table 33. Four spaced seating blocks 71 (two shown) are mounted on the top 34 of the table 33 to provide a seat for the four corners of the bottom surface of the open-top housing and to insure that the screen 54 is positioned the proper distance above the platen 36.

A sensor bar, designated generally by the numeral 73, is positionable over the rear edge of the web 21 and provides support for facilities to be described herein later which assist in locating successive web sections 24 in position for a screen printing operation. A controller 74 is provided for assisting in controlling the sequential operation of the apparatus 31. The controller 74 of the preferred embodiment includes a micropressor, a read only memory, a random access memory and related interface facilities to respond to conditions in the screen printing apparatus 31 and control the screen printing process. The controller 74 could be another type of sequence controller. For example, the controller 74 could be a completely hard-wired system using limit switches, relays and other conventional equipment. Also, the controller 74 could be an electro-mechanical controller using limit switches, relays, cams and cam followers mounted on the same shaft, or coupled shafts, to insure proper timing of the various operations.

The screen printing mechanism 48 and the fixed table 33 are of the type which is commercially available as Itron Printer Model TNTW from The Dia-Print Company, Inc. of Phoenix, Ariz.

As further illustrated in FIG. 3, idler rollers 76 and 77 are used to facilitate the provision of web loops 78 and 79. A curing oven 81 is also illustrated.

Referring to FIG. 4, the fixed table 33 is supported by four angle-bar legs 82 which are seated on a floor 83 of the cabinet 32.

Referring to FIGS. 4, 5 and 6, the vertical mover 62 for the screen printing mechanism 48 includes a platform 84 which is mounted to the floor 83 of the housing 32. A rotary actuator 86 is mounted on the platform 84 and, upon the application of air pressure thereto, rotates a shaft 87 less than one revolution. The shaft 87 is coupled to one end of a clamp arm 88 which extends laterally from the axis of the shaft. The other end of the clamp arm 88 has a shaft 89 coupled thereto which extends laterally from the clamp arm. A pair of brackets 91 and 92 are supported on the shaft 89 for free and independent rotation relative to the shaft.

A bell crank arm, designated generally by the numeral 93, is mounted for rotation at its elbow 94 to a vertical stand 96 as illustrated further in FIG. 6. A front extension 97 of the arm 93 is coupled to the shaft 89 for movement therewith while a rear extension 98 of the arm remains free of connection. A brace 99 is attached to the vertical stand 96 and supports a pair of spaced proximity switches 101 and 102 which are located below the front and rear extensions 97 and 98, respectively. A stop 103 (FIG. 5) is mounted on the platform 84 in the path of downward travel of the end of the clamp arm 88 which has the shaft 87 mounted thereto.

The brackets 91 and 92 support the lower end of an air cylinder 104 which has a piston rod 106 (FIGS. 4 and 5) extending from the upper end thereof. The piston rod 106 is connected to a pipe "T" joint 107 which is coupled to "L" shaped pipe braces 108 and 109 as more clearly illustrated in FIG. 4. Pipe braces 108 and 109 extend upwardly and into the housings 63 and 64, respectively, and are coupled to the side walls 52 and 53, respectively, to facilitate vertical positioning of the screen printing mechanism 48.

In operation, the rotary actuator 86 is controlled to transmit motion through the unactuated air cylinder 104 to the pipe braces 108 and 109. Movement of the braces 108 and 109 results in the vertical positioning of the screen printing mechanism. The front and rear extensions 97 and 98 of the bell crank arm 93 are positionable in the proximity of the switches 101 and 102, respectively, to provide for a limited-travel control of the screen printing mechanism 98.

Figure 9:
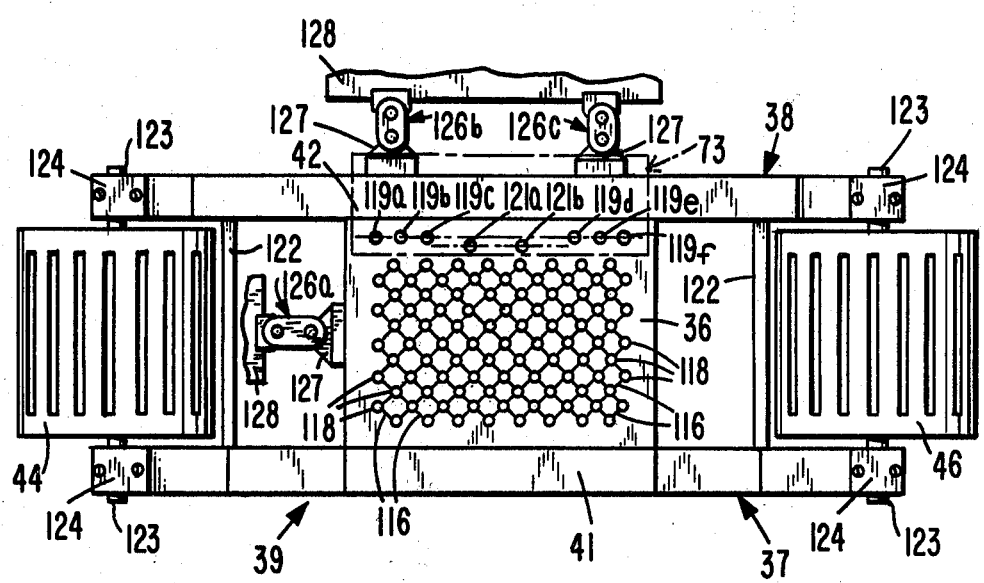
FIG. 9 is a top view showing the platen assembly of FIG. 7 and further showing linkages for providing adjusting movement of the platen assembly in accordance with certain principles of the invention.

Referring now to FIGS. 7 and 9, the floating platen assembly 39 includes the platen 36 and the side arms 37 and 38 with the vacuum drums 44 and 46 supported thereon. The platen 36, and thereby the assembly 39, is supported by four vertical columns 111 which are solid steel rods. The columns 111 are of sufficient strength to support the platen assembly 39 but have excellent flexing properties to permit limited, substantially frictionless movement of the platen 36 generally in the plane thereof. Each of the columns 111 is mounted in an associated one of four foot blocks 112 which are secured to the cabinet floor 83. Referring to FIG. 8, the upper end of each of the columns 111 is mounted in an associated one of four head blocks 113 (one shown) which are further secured to the underside of a platen bottom plate 114.

As illustrated in FIGS. 7, 8 and 9, the platen 36 is formed in the top surface thereof with a plurality of diagonal, intersecting grooves 116. Apertures 117 are formed through the platen 36 at each intersection of the grooves 116. The apertures 117 communicate with a plenum chamber 118 (FIG. 8) formed by the top surface of the plate 114 and a shallow recess formed in the underside of the platen 36. An opening is provided in plate 114 to facilitate the application of a vacuum to the top of the platen 36. The platen 36 is also formed with six, spaced windows 119a–119f which are formed through the platen and which are aligned with each other. The platen 36 is also formed with two, spaced windows 121a and 121b which are formed through the platen and aligned with each other but not with the windows 119a–119f.

Referring to FIGS. 7 and 9, a pair of braces 122 are secured at opposite ends to the side arms 37 and 38. As illustrated in FIG. 9, the vacuum drums 44 and 46 are supported at the extreme ends of the side arms 37 and 38. Axial shafts 123 and the drums 44 and 46 rest in the "V" notches 47 of the side arms 37 and 38 and are secured therein by caps 124.

The entire weight of the platen assembly 39, including the vacuum drums 44 and 46, are supported by the four slender columns 111. The columns 111 establish parallelism between the platen 36 and the floor 83 of the cabinet 32. The platen assembly 39 can be moved with relative ease generally in the plane of the platen 36. When the platen assembly 39 is moved, there is no sliding-movement engagement between facing surfaces but rather there is only slight flexing of the columns 111. Consequently, there is no friction to overcome in shifting the platen assembly 39.

Referring to FIG. 9, three linkages 126a–126c are each coupled at one side thereof to an associated one of three brackets 127a–127c, respectively, which are secured to the platen assembly 39. The other side of each of the linkages 126a–126c are secured to a fixed portion 128 of the cabinet 32. The linkage 126a is used to provide limited aligning movement of the platen assembly 39 in the direction of travel of the web 21 which direction is referred to as the "X" direction. The linkages 126b and 126c operate independently of each other and are used to provide limited aligning direction lateral to the direction of travel of the web 21 which direction is referred to as the "Y" direction.

Figure 10:
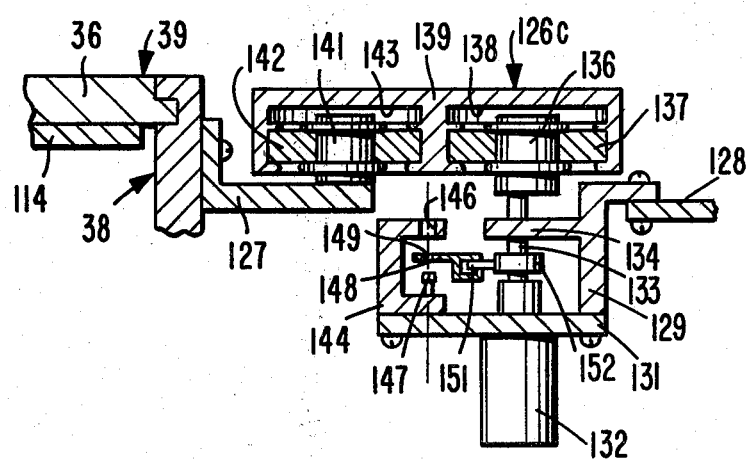
FIG. 10 is a sectional view taken along line 10—10 of FIG. 9 showing coupling details of the linkage in accordance with certain principles of the invention.

Each of the linkages 126a–126c is composed of identical elements and operates in the same manner. Therefore, the detailed structure and operation of linkage 126c, as illustrated in FIG. 10, will be explained with the understanding that linkages 126a and 126b are of the same structure and operate in the same manner. However, it is noted that the bracket 127a is secured to the platen 36 while brackets 127b and 127c are secured to side arm 38 adjacent to the platen.

As illustrated in FIG. 10, linkage 126c includes a support bracket 129 which is secured to the fixed portion 128 of the cabinet 32. A bottom plate 131 is secured to the bracket 129 and provides support for a D.C. gear motor 132. A shaft 133 extends from the motor 132 and through a support arm 134 of the bracket 129. A short shaft 136 is mounted on the upper end of the shaft 133 off center of the shaft so that the short shaft 136 functions as an eccentric. The shaft 136 is surrounded by a circular bearing 137 which is contained within one inverted circular recess 138 of a linkage coupler 139.

Another short shaft 141 is fixedly secured to the bracket 127 and is surrounded by a circular bearing 142 which is contained within another inverted circular recess 143 of the linkage coupler 139. When the motor 132 is operated, the eccentric shaft 136 is rotated. Movement of the eccentric shaft 136 within the recess 138 causes the linkage coupler 139 to move. Movement of the linkage coupler 139 causes movement of the shaft 141 which movement is transmitted to the platen assembly 39. In this manner, positioning of the platen assembly 39 is attained.

A vertical stand 144 is mounted on the bottom plate 131 and is formed with an opening which provides support for a photo-diode 146 having two sensing elements. The photo-diode 146 is of the type described in the aforementioned U.S. Pat. No. 4,109,158. An infra-red light source 147 is also mounted on the stand 144 in alignment with, but spaced from, the photo-diode 146. A flag 148 having a window 149 formed therein is attached to a spring-biased cam follower 151 which is mounted to a fixed portion (not shown) of the cabinet 32. The cam follower 151 is spring-biased into continuous engagement with an eccentric cam 152 mounted on the shaft 133.

When the platen assembly 39 is located in a "dead-center" position, which is representative of the precise alignment of the platen 36 with the pattern on the screen 54, the window 149 of the flag 148 is precisely aligned with the photo-diode 146 and the light source 147 so that equal amounts of light fall upon the two sensing elements of the photo-diode. Thus, there is no voltage output from the photo-diode 146. During a screen-printing cycle, the motor 132 may be operated to selectively move the platen assembly 39 away from the "dead-center" position. When this occurs, the cam follower 151 follows the cam 152 whereby the flag 148 moves. When the flag 148 moves, the window 149 is moved whereby some portion of the light from the light source 147 is blocked by the flag. This results in a light imbalance on the two sensing elements of the photo-diode 146. Therefore, a voltage output appears at the photo-diode 146. Ultimately, it is desired to return the platen assembly 39 to the "dead-center" position. At that time, the voltage output of the photo-diode 146 output is used to control the motor 132 whereby the cam 152 rotates to facilitate movement of the flag 148. The flag 148 moves to position the window 149 in precise alignment with the photo-diode 146 and the light source 147. When balanced light falls on the two sensing elements, the voltage output of the photo-diode 146 drops to zero whereby the motor 132 ceases to operate. At this time, the platen assembly 39 is located at the "dead-center" position.

Referring to FIG. 11, the sensor bar 73 is formed with at least four apertures for supporting three photo-diodes 153a–153c and a phototransistor 154. The phototransistor 154 is alignable with an infra-red light source 156 through window 121a. The photo-diode 153b is alignable with an infra-red light source 157 through slot 26 and window 121b and assists in the "X" direction positioning of the web section 24 and the platen 36 relative to the pattern on the screen 54 (FIGS. 3 and 4). The photo-diodes 153*a* and 153*c* are alignable with infra-red light sources (not shown) through slots 27 and 28, respectively, and windows 119*c* and 119*d* (FIGS. 7 and 9), respectively, to assist in the "Y" direction positioning of the web section 24 and the platen 36 relative to the pattern on the screen 54. In the preferred embodiment, the sensor bar 73 is formed with four other apertures (not shown) to support two additional sets of photo-diodes (not shown) which are alignable with infra-red light sources (not shown), web section "Y" slots (not shown) and selected pairs of the windows 119*a* and 119*f* or 119*b* and 119*e* to assist in the "Y" direction positioning of the web section 24 of different codes. Also, in the preferred embodiment, the different pairs of "Y" direction photo-diodes are manually selectable by switch operation. Also, light emitting diodes (not shown) are mounted on the exterior of the sensor bar 73 adjacent to the location of each "Y" direction photo-diode and are operated in pairs to indicate the selected set of photo-diodes which is operable for a web positioning operation.

During the operation of the apparatus 31, and particularly during the screen printing operation, the sensor bar 73 must be retracted from the position illustrated in FIGS. 3 and 11. Referring to FIG. 12, a retracting mechanism, designated generally by the numeral 158, is attached to the sensor bar 73 to retract the sensor bar from the aligning position illustrated in the FIG. A fixed frame 159 of the cabinet 32 provides support for an extension platform 161. The platform 161 supports a shelf 162 which, in turn, provides support for the infra-red light sources, such as light source 157, positioned beneath the sensor bar 73. One set of elements, including photo-diode 153*b*, slot 26, window 121*b* and light source 157, are shown in alignment and are merely illustrative of the other similar sets of aligned elements associated with the sensor bar 73 when the sensor bar is in the position illustrated in FIG. 11.

A pad 163 is mounted on the fixed frame 159 and supports at one end of the sensor bar 73 an arrangement of elements including a pair of linkage arms 164 and 166 for pivotal movement relative thereto. A rotary actuator 167 rotates a pulley 168 which drives a belt 169. The belt 169 is positioned over another pulley 171 attached to a fixed stand 172. The pulley 171 is coupled to a shaft 173 which is further coupled to a pivotal arm 174. The arm 174 is further coupled to a linkage arm 176.

A similar arrangement of elements is located at the other end of the sensor bar 73 with both arrangements being generally illustrated in FIG. 11.

In operation, the rotary actuator 167 drives the belts 169 in the direction of the arrow to rotate the arms 174 through 180°. Through the arrangement of the linkage arms 164, 166 and 176, the sensor bar 73 is first raised and moved to the right as viewed in FIG. 12 and then lowered to the retracted position illustrated in phantom. In this manner, the sensor bar 73 is retracted from a position over the web 21 to permit the effecting of a screen printing operation.

When the infra-red sources are initially assembled on and secured to the shelf 162, particular care is taken to insure that the light sources are precisely located with respect to the pattern formed on the screen 54. Also, the corresponding windows of the platen 36 and the photo-diodes and phototransistor of the sensor bar 73 are precisely located with respect to the light sources and, thereby, the pattern on the screen 54. This establishes the "dead-center" position of the platen assembly 39. With the "dead-center" position established, the flag 148 (FIG. 10) is adjusted so that balanced light falls upon the photo-diode 146. This permits the motor 132, under control of the photo-diode 146, to return the platen assembly 39 of the "dead-center" position after each screen printing operation.

Thus, the fixed-position mounting of the light sources and the alignment therewith of the photo-diodes, both relative to the pattern on the screen 54, provide the relationship between the pattern and positioning of each web section 24 on the platen 36 relative to the pattern. As will be seen later, the establishment of the "dead-center" position serves to establish a reference alignment or location for the web section 24 with respect to the pattern on the screen 54. Even though the web section 24 may be fed into the screen printing location in an askewed position, by initially referencing the platen 36 to the pattern at the "dead-center" position, the web section can then be referenced to the platen for subsequent positioning relative to the pattern.

In use of the apparatus 31, the screen printing mechanism 48 is placed in the upper or raised position as illustrated in FIG. 3. The sensor bar 73 is placed in the retracted position. A switch (not shown) is operated to select the proper photo-diodes in the sensing bar 73 for the code of circuit to be manufactured. Ink is deposited onto the screen 54 adjacent to the front wall 49 of the screen printing mechanism 48.

A supply roll of the web 21 is placed in a supply stand (not shown). The leading end of the web 21 is drawn from the supply stand, passed partially over the idler roller 76, the vacuum drum 44 and over the platen 36. The leading end of the web 21 is further passed partially over the vacuum drum 46, the idler roller 77, into the curing oven 81 and ultimately onto a take-up stand (not shown) of a type similar to the supply stand. Further, the web loops 78 and 79 are also formed to provide sufficient web material for the vacuum drums 44 and 46 to perform the web-aligning process.

The web loops 78 and 79 also provide slack or relaxed portions of the web 21 between the idler roller 76 and the vacuum drum 44 and, further, between the vacuum drum 46 and the idler roller 77. The relaxed portions of the web 21 formed by the web loops 78 and 79 permit subsequent aligning manipulation of the platen assembly 39 and the portions of the web between the vacuum drums 44 and 46 without stretching or tearing the portions of the web which form the web loops.

Initially, vacuum is applied to the vacuum drums 44 and 46 to grip the portions of the web 21 which are positioned about the vacuum portion of the drums and to thereafter hold taut the portions of the web 21 which are extending between the vacuum drums. Thereafter the rotary actuator 167 is controlled to move the sensor bar 73 to the sensing position as illustrated in FIGS. 3, 11 and 12. Rotational drive is applied to the vacuum drums 44 and 46 to draw successive web sections 24 from the supply and move the sections into the screen printing position between the screen printing mechanism 48 and the platen 36. It is noted that the portions of the web 21 between the vacuum drums 44 and 46 usually move into the screen printing position in a slightly askewed condition relative to the platen 36 due to limited lateral movement of the web as it passes between the vacuum drums. Therefore, the web sections 24 are usually initially askew with respect to the pattern on the screen 54.

Referring to FIG. 11, as the illustrated web section 24 of the web 21 is fed in the direction of the arrow, the slot 26 formed therein passes over the window 121a formed in the platen 36. Infra-red light emanating from the light source 156, passes through the window 121a and the slot 26 and is detected by the phototransistor 154. A signal is developed in response to the detected light and the vacuum drums 44 and 46 are controlled to operate at a much slower speed.

Eventually, the slot 26 moves over the window 121b of the platen 36 and light from the infra-red light source 157 is directed onto the two sensing elements of the photo-diode 153b. At this time, control of operation of the vacuum drums 44 and 46 is assumed by the output voltage of the photo-diode 153b. If the slot 26 is not aligned with the window 121b, unbalanced light falls upon the two sensing elements of the photo-diode 153b and an output voltage results. The voltage controls the operation of the vacuum drums 44 and 46 until balanced light falls upon the two sensing elements of the photo-diode 153. At this time the slot 26 is aligned over the window 121b.

As the slot 26 is being aligned with the window 121b, slots 27 and 28 are thereby also being generally aligned with windows 119c and 119d (FIGS. 7 and 9) whereby light emanating from infra-red sources (not shown) fixedly mounted on the shelf 162 (FIG. 12) fall upon the sensing elements of the photo-diodes 153a and 153c, respectively. However, the output circuits (not shown) of the photo-diodes 153a and 153c are not activated at this time and the output voltage thereof is not utilized.

Typically, when the web 21 is fed between the vacuum drums 44 and 46, the web sections 24 shift laterally and are not perfectly aligned with the platen 36. Consequently, when slots 27 and 28 align generally with windows 119c and 119d, unequal amounts of light fall upon the sensing elements of the photo-diodes 153a and 153c, respectively. Even though the vacuum drums 44 and 46 are no longer rotating, the drums continue to vacuumly grip the adjacent portions of the web 21 to hold taut the web portions extending between the drums.

Upon general alignment of the slot 26 with the window 121b, vacuum is applied through the plenum 118 (FIG. 8) and apertures 117 to the grooves 116 of the platen 36 to vacuumly grip the positioned web section 24 with the platen. The vacuum gripping is effected even though the web section 24 is not perfectly aligned with the platen 36 which, as noted hereinbefore, has been previously aligned with the screen pattern during set-up of the apparatus 31. Thereafter, the output of photo-diode diode 153b is used to control the linkage 126a (FIG. 9) and the outputs of the photo-diodes 153a and 153c are used to control the linkages 126b and 126c, respectively. Assuming that the light falling upon the sensing elements of photo-diodes 153a and 153c is unbalanced, the linkages 126b and 126c, respectively, are controlled individually to position the platen assembly 39 accordingly. As previously described, the slot 26 has been aligned with the window 121b and the web section 24 vacuumly gripped with the platen 36. In this condition, balanced light falls upon the two sensing elements of photo-diode 153b. However, when linkages 126b and 126c move the platen assembly 39 in the "Y" direction to permit balanced light to fall upon the sensing elements of photo-diodes 153a and 153c, the light passageway formed by the slot 26 and window 121b may shift. This shift will result in unbalanced light falling upon the sensing elements of photo-diode 153b whereby an output voltage appears at the photo-diode. The output voltage of photo-diode 153b is then used to control the movement of linkage 126a (FIG. 9) to work in conjunction, and simultaneously, with linkages 126b and 126c to move the platen assembly 39 vectorily until balanced light falls upon the sensing elements of the photo-diodes 153a, 153b and 153c. Thus, the platen 36 which had been previously placed in reference alignment with the screen pattern, is moved out of alignment therewith to effectively move the previously askewed, vacuumly gripped web section 24 into precise alignment with the screen pattern.

Movement of the linkages 126a, 126b and 126c moves the floating platen assembly 39 by virtue of the flexing property of the columns 111 (FIG. 7) in a frictionless effort. The floating aspect of the platen assembly 39 permits the necessary movement of the assembly with relative ease and relatively quick. Since there is no static friction to overcome when movement of the floating platen assembly 39 is initiated, relatively little effort is required to quickly move the assembly to the precisely aligned position. Further, return to the "dead-center" position is accomplished quickly and with relative ease.

After the platen assembly 39 has been positioned to align the gripped web section 24 with the photo-diodes 153a-153c, the rotary actuator 167 (FIG. 11) is controlled to retract the sensor bar 73 to the position illustrated in phantom in FIG. 11. The rotary actuator 86 (FIGS. 4 and 5) is operated to lower the screen printing mechanism 48 to seat the mechanism on seating blocks 71 (FIG. 4). As the screen printing mechanism 48 (FIG. 3) is being lowered, the cross arm 56 is moved toward the rear wall 51 whereby the flooding bar 58 spreads or floods the ink over the upper surface of the screen 54 but not through the pattern openings in the screen.

As the screen printing mechanism 48 is lowered, the locating pins 66 and 67 move into the apertures 68 and 69, respectively, to insure accurate positioning of the screen 54 with respect to the precisely positioned web section 24 gripped by the platen 36.

After the screen printing mechanism 48 has seated on the blocks 71, the air cylinder 61 is controlled to position the squeegee 59 in position for an ink-wiping, screen printing operation. Thereafter, the cross arm 56 is moved toward the forward wall 49 whereby the squeegee 59 wipes the flooded ink through the pattern openings formed in the screen 54 and onto the layer 23 of copper of the positioned web section 24. This results in the screen printing operation. The squeegee 59 further wipes the excess ink into a pool adjacent to the forward wall 49 in preparation for the next flooding operation.

The rotary actuator 86 is then controlled to raise the screen printing mechanism 48. The vacuum previously applied to the platen 36 is removed. The circuit which includes the photo-diodes 146 (FIG. 10), which are associated with the linkages 126a-126c (FIG. 9), is activated to facilitate control of the motors 132 to return the floating platen assembly 39 to the "dead-center" position as previously described. When the platen assembly 39 has been returned to the "dead-center" position, the circuit which includes the photo-diodes 146 is deactivated.

The rotary actuator 167 (FIG. 11) is then controlled to return the sensor bar 73 to the sensing position as illustrated in FIG. 11. Rotational drive is again applied to the vacuum drums 44 and 46 to advance the next succeeding web section 24 into a screen printing location beneath the raised screen printing mechanism 48. This initiates the next cycle which is a repeat of the previous cycle of operation.

When the screen printing mechanism 48 is to be cleaned, the rotary actuator 86 (FIGS. 4 and 5) is controlled to raise the screen printing mechanism to the normal operational height. Then, the air cylinder 104 (FIGS. 4 and 5) is controlled to raise the screen printing mechanism 48 to an additional height whereat the mechanism can be cleaned.

In summary, the platen 36 and the photo-diode/light-source system of the sensor bar 73 are initially aligned with and referenced to the pattern of the screen 54 during the set up of the apparatus 31 to establish a reference alignment between the platen and the screen pattern. When the vacuum drums 44 and 46 feed the web sections 24 into the screen printing position, limited lateral movement occurs in the portions of the web 21 extending between the drums whereby the web sections are located over the platen 36 in a slightly askewed condition. The drums 44 and 46, which are supported with the platen 36 by the four columns 111 on the floating platen assembly 39, hold taut the portions of the web 21 extending therebetween. The photo-diode system which includes the sensor bar 73 aligns generally the web section 24 with the platen 36 through the facility of window 121b and slot 26 whereafter the section is vacuumly gripped with platen. The photo-diode system which includes the sensor bar 73 then compensates for the slightly askewed condition of the web section 24 by manipulating the platen assembly 39, including the vacuum drums 44 and 46, to askew the platen 36 from the reference or "dead-center" position and bring the vacuumly gripped section into precise alignment with the pattern on the screen 54.

The initial alignment of the platen 36 with the pattern on the screen 54 provides the reference alignment or position for the subsequent precise alignment of the web section 24 with the pattern. The floating support of the platen assembly 39, including the platen 36 and the vacuum drums 44 and 46, permit frictionless adjustment of the platen assembly with the web section 21 for precise alignment of the section with the pattern on the screen 54. Further, by mounting the vacuum drums 44 and 46 on the same support with the platen 36, the entire portion of the web 21 between the drums is moved with the platen assembly 39 during the precise alignment of the web section 24 with the pattern on the screen 54. This prevents distortion of the portion of the web 21 between the vacuum drums 44 and 46 during the precise alignment process. Further, the presence of the web loops 78 and 79 provide excess portions of the web 21 adjacent to the vacuum drums 44 and 46. This permits the drums 44 and 46 to freely move the web section 24 during the period when slot 26 is being aligned with window 121b without pulling trailing portions of the web 21 from the supply stand or from the direction of the oven 81. Also, the loops 78 and 79 provide relaxed portions of the web 21 which permit precise alignment of the web section 24 by shifting of the platen assembly 39 without stretching or tearing portions of the web between the supply stand and the vacuum drum 44 and between the vacuum drum 46 and the oven 81.

What is claimed is:

1. Apparatus for precisely aligning an intermediate section of a first element with a second element where the first element has portions at opposite sides of the intermediate section, which comprises:

means for gripping the first element;
   means for initially aligning the gripping means with the second element to establish a reference alignment;
   means for moving the intermediate section of the first element into general alignment with the gripping means where the intermediate section is gripped by the gripping means;
   means for moving the gripping means with respect to the reference alignment to align precisely the intermediate section with the second element;
   means, forming a portion of the first-element moving means, for holding the portion of the first element at opposite sides thereof; and
   means for supporting together the gripping means and the first-element moving means to prevent distortion of the intermediate section of the first element during the precise alignment thereof with the second element.

2. The apparatus as set forth in claim 1, wherein the supporting means includes:
   means for providing frictionless movement of the gripping means and the first-element moving means when the first element is being precisely aligned with the second element.

3. The apparatus as set forth in claim 2 wherein the means for providing frictionless movement of the gripping means includes;
   a fixed surface;
   at least three slender flexible columns; and
   means for securing one end of each of the columns to the fixed surface and for securing the other end to the gripping means to permit frictionless movement of the gripping means by flexing movement of the columns at the end adjacent to the gripping means.

4. The apparatus as set forth in claim 1, wherein the first element is a continuous web having the intermediate section, the portions on opposite sides of the intermediate section and continuous lengths which extend from the opposite sides in directions away from the intermediate section, which further comprises:
   means for forming relaxed portions in the continuous lengths adjacent to the first element moving means.

5. The apparatus as set forth in claim 1 wherein the means for holding opposite-side portions of the first element includes:
   a pair of rotary drums having slots formed therein; and
   means for applying a vacuum to the slots to grip the portions of the first element adjacent to the slots whereat the vacuum is applied; and wherein the means for supporting together the gripping means and the first-element moving means includes:
   a pair of spaced parallel side arms supporting the means for gripping the first element between intermediate portions of the side arms and supporting for rotation the pair of rotary drums between opposite ends of the arms.

6. Apparatus for precisely aligning an intermediate section of a first element with a second element, which comprises:
   a pair of spaced side arms;
   a platen supported on and between an intermediate portion of the side arms;
   a pair of rotary drums mounted on the opposite ends of the side arms at opposite sides of the platen;

the side arms, platen and rotary drums forming a platen assembly;

the platen assembly being positioned in precise alignment with the second element;

means for applying a vacuum through the rotary drums to grip portions of the first element on opposite sides of the intermediate section;

means for rotating the rotary drums to move the first element between the drums and over the platen;

means for controlling the rotary drums to position the intermediate section of the first element in general alignment with and over the platen;

means for applying a vacuum through the platen to grip the generally aligned intermediate section of the first element;

a plurality of linkages for moving the platen assembly;

each linkage including:
- a linkage coupler formed with two spaced recesses having walls;
- a first shaft attached to the platen assembly and positioned within a first of the two recesses of the linkage coupler;
- a second shaft positioned within a second of the two recesses of the linkage coupler; and
- fixedly mounted means for rotating the second shaft in an eccentric motion whereby the eccentric motion is transmitted to the wall of the second recess to provide motion for the linkage coupler and, thereby, the platen assembly; and means for controlling the fixedly mounted rotating means to selectively move the linkage couplers and thereby the platen assembly to precisely align the intermediate section of the first element with the second element.

7. The apparatus as set forth in claim 6, which further comprises:
a fixed surface;
four slender flexible columns; and
means for securing one end of each of the columns to the fixed surface and for securing the other end to the platen assembly to permit frictionless movement of the platen assembly by flexing movement of the columns at the end adjacent to the platen assembly.

8. The apparatus as set forth in claim 6, which further comprises:
a pair of idler rollers positioned spatially from opposite ends of the platen assembly and adjacent to the rotary drums to support portions of the first element located thereon and to provide for the formation of relaxed portions of the first element between the ends of the platen assembly and the spaced idler rollers.

9. Apparatus for precisely aligning a first element with a second element, which comprises:
means for gripping the first element;
means for initially aligning the gripping means with the second element to establish a reference alignment where the aligning means includes:
a plurality of windows formed in the gripping means;
a plurality of light emitting devices corresponding in number to the plurality of windows;
means for supporting the plurality of light emitting devices in precise alignment with the second element;
a plurality of light sensitive devices corresponding in number to the plurality of windows;
means for supporting the plurality of light sensing devices in precise alignment with the plurality of light emitting devices; and
means for initially supporting the gripping means in a position whereat the plurality of windows are precisely aligned with the plurality of light emitting devices and the plurality of light sensing devices;
means for moving the first element into general alignment with the gripping means where the first element is gripped by the gripping means; and
means for moving the gripping means with respect to the reference alignment to align precisely the first element with the second element.

10. Apparatus for precisely aligning a first element with a second element, which comprises:
means for gripping the first element;
means for initially aligning the gripping means with the second element to establish a reference alignment;
means for moving the first element into general alignment with the gripping means where the first element is gripped by the gripping means where the moving means includes:
at least one window formed in the gripping means;
a light sensitive device;
means for supporting the gripping means so that the window thereof is alignable with the light sensitive device;
a light emitting device;
means for supporting the light emitting device in alignment with at least the light sensitive device;
means for moving the first element relative to the gripping means to position the slot of the first element into general alignment with the window, light emitting device and the light sensitive device; and
means, included with the light sensitive device, for controlling the first-element moving means to position the slot in general alignment with the window; and
means for moving the gripping means with respect to the reference alignment to align precisely the first element with the second element.

11. Apparatus for precisely aligning a first element with a second element wherein the first element is formed with a plurality of precisely located slots, which comprises:
means for gripping the first element;
means for initially aligning the gripping means with the second element to establish a reference alignment;
means for moving the first element into general alignment with the gripping means where the first element is gripped by the gripping means; and
means for moving the gripping means with respect to the reference alignment to align precisely the first element with the second wherein the means for moving the gripping means includes:
a plurality of windows formed at precise locations in the gripping means;
a plurality of light emitting devices corresponding in number to the plurality of windows;
means for supporting the plurality of light emitting devices in precise alignment with the second element;

a plurality of light sensing devices corresponding in number to the plurality of windows;

means for supporting the plurality of light sensing devices in precise alignment with the plurality of light emitting devices; and means, attached to the gripping means and responsive to the general alignment of the slots of the first element with the windows of the gripping means and the light emitting and light sensitive devices, for positioning the gripping means to precisely align the first element with the light emitting devices and thereby with the second element.

12. The apparatus as set forth in claim 11, which further comprises:

means for supporting for movement the light sensitive devices supporting means; and means for moving the movement-supporting means.

13. The apparatus as set forth in claim 11 wherein the positioning means includes:

a plurality of the linkages;

each of the linkages including:

a linkage coupler formed with two spaced recesses having walls;

a first shaft attached to the gripping means and positioned within a first of the two recesses of the linkage cover;

a second shaft positioned within a second of the two recesses of the linkage coupler; and fixedly mounted means for rotating the second shaft in an eccentric motion whereby the eccentric motion is transmitted to the wall of the second recess to provide motion for the linkage coupler.

14. The apparatus as set forth in claim 13 wherein each of the linkages of further includes:

means for controlling the rotating means to locate the second shaft in a precise position within the second recess of the linkage coupler when the gripping means is to be returned to the reference alignment with the second element after the gripping means has been moved to align precisely the first element with the second element.

* * * * *